United States Patent [19]
Bertoluzzi et al.

[11] Patent Number: 5,485,127
[45] Date of Patent: Jan. 16, 1996

[54] INTEGRATED DYNAMIC POWER DISSIPATION CONTROL SYSTEM FOR VERY LARGE SCALE INTEGRATED (VLSI) CHIPS

[75] Inventors: Renitia J. Bertoluzzi, Saratoga, Calif.; Robert T. Jackson, Boynton Beach; Stephen D. Weitzel, Boca Raton, both of Fla.

[73] Assignees: Intel Corporation, Santa Clara, Calif.; International Business Machine Corp., Armonk, N.Y.

[21] Appl. No.: 418,849

[22] Filed: Apr. 7, 1995

Related U.S. Application Data

[63] Continuation of Ser. No. 175,767, Dec. 29, 1993, abandoned.

[51] Int. Cl.$^6$ .................................................... H03L 1/02
[52] U.S. Cl. ............................... 331/69; 331/14; 331/176
[58] Field of Search .................................. 331/140, 250, 331/68, 69, 70, 176; 395/750; 455/260; G06F 1/26

[56] References Cited

U.S. PATENT DOCUMENTS

| | | | |
|---|---|---|---|
| 4,454,483 | 6/1984 | Baylor | 331/11 |
| 4,675,617 | 6/1987 | Martin | 331/1 A |
| 4,717,891 | 1/1988 | Ichise et al. | 331/17 |
| 5,172,075 | 12/1992 | Yerbury et al. | 331/14 |
| 5,268,654 | 12/1993 | Furutani et al. | 331/10 |
| 5,389,899 | 2/1995 | Yahagi et al. | 331/10 |

FOREIGN PATENT DOCUMENTS

| | | | |
|---|---|---|---|
| 0496534 | 7/1992 | European Pat. Off. | G06F 1/26 |
| 0497474 | 8/1992 | European Pat. Off. | G06F 1/26 |

*Primary Examiner*—Robert J. Pascal
*Assistant Examiner*—David H. Vli
*Attorney, Agent, or Firm*—Blakely, Sokoloff, Taylor & Zafman

[57] ABSTRACT

Chip logic, a frequency multiplication and/or division, a temperature sensing circuit, and a power management circuit, are integrated on a very large scale integrated (VLSI) circuit chip. The temperature sensing circuit directly measures the chip temperature, producing a temperature output signal. The power management circuit, which is connected to the temperature sensing circuit and to the chip logic, responds to the temperature output signal and to a functional state of the chip logic to generate a control signal to the PLL. The PLL responds to the control signal to either stop the clock signal or modify the operating frequency of the clock signal, depending upon the state of the control signal.

22 Claims, 3 Drawing Sheets

INTEGRATED DYNAMIC POWER DISSIPATION CONTROL SYSTEM FOR VERY LARGE SCALE INTEGRATED (VLSI) CHIPS

This is a continuation of application Ser. No. 08/175,767, filed Dec. 29, 1993, now abandoned.

BACKGROUND OF THE INVENTION

1. Field of the Invention

The present invention is related to very large scale integrated circuit chips and more specifically to a method and apparatus for maintaining functional operation when chip temperatures exceed operating temperature specifications.

2. Prior Art

A notebook computer is a small, lightweight, portable, battery-powered, lap-top personal computer (PC) that uses a thin, lightweight, display screen such as a liquid crystal display (LCD). Notebook PCs typically run several hours on rechargeable batteries, weigh 4–7 pounds, fold up, and can be carried like a briefcase. Because of their small size and portability these small devices are often times exposed to environments where the temperature range for which the microprocessor chips were designed is greatly exceeded. This could lead to intermittent operation of the device and a shortened lifetime of the integrated circuit chips that make up the device's logical circuits.

Phase-locked loop (PLL) clocks are placed on integrated circuit chips to minimize clock delay skew between a board-level system clock and latches fabricated on the chip. The delay skew is created by the number of buffering levels needed on the chip to distribute the clock signal to all of the latches on the chip. PLL's can also change the frequency of the board level system clock so that the chip clock frequency is higher or lower than the board level system clock. It is well known that logical circuits consume power in proportion to the frequency at which they operate. The higher the operational frequency, the higher the power dissipation. By controlling the clock frequency to the logic, one can control the power dissipation.

It is therefore an object of this invention to provide a method and means for controlling the temperature of a very large scale integrated (VLSI) circuit chip by controlling phase locked loop (PLL) clock circuitry existing on the chip.

SUMMARY OF THE INVENTION

Briefly, the above object is accomplished in accordance with the invention by providing chip logic, a phase locked loop (PLL) clocking circuit, a temperature sensing circuit, and a power management circuit, all fabricated on a very large scale integrated (VLSI) circuit chip. The temperature sensing circuit directly measures the chip temperature, producing a temperature output signal. The power management circuit, which is connected to the temperature sensing circuit and to the chip logic, responds to the temperature output signal and to a functional state of the chip logic to generate a control signal to the PLL. The PLL responds to the control signal to change the operation of the PLL, by either stopping the clock or modifying the operating frequency thereof, depending upon the state of the control signal.

An advantage of this invention is that excessive system temperatures on a chip are regulated by controlling the effective duty cycle of a chip clock.

A further advantage of this invention is that it allows a device to operate at reduced system performance levels while temperatures at the chip level are being reduced.

A further advantage of this invention is that it allows a device to operate at above specified system performance levels when temperatures at the chip are below designated levels.

The foregoing and other objects, features, and advantages of the invention will be apparent from the following more particular description of a preferred embodiment of the invention as illustrated in the accompanying drawings.

DESCRIPTION OF THE PREFERRED EMBODIMENT

Figure 1:
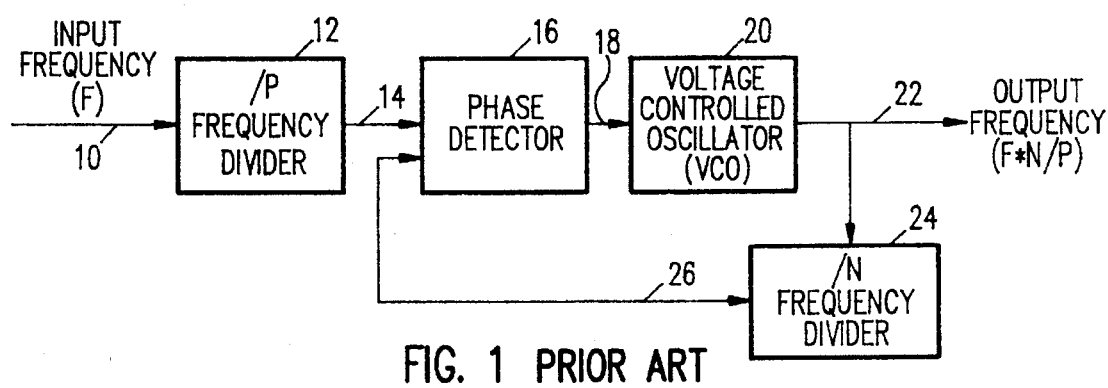
FIG. 1 is a diagram of a prior art phase locked loop clock circuit.

FIG. 1 is a diagram of a prior art phase locked loop (PLL) clock circuit that is capable of frequency multiplication. An input signal (10) from a system clock is divided by a divide by P (/P) frequency divider (12). The PLL consists of a closed loop including a phase detector (16), a voltage controlled oscillator (VCO20), and a divide by N (/N) frequency divider (24). A phase difference and frequency difference between the signals (14) and (26) are detected in the phase detector (16) and an error signal (18) corresponding to the detected differences is output to the VCO (20). The VCO provides an output (22) that is phase-locked with the input signal(10). The /N frequency divider (24) divides the frequency of the signal (22) by N and feeds it back to the phase detector (16) so that the frequency is locked. The variables P and N of the frequency dividers can be programmed with values to provide a variable frequency output selected by the values of P and N. The /P circuit provides one pulse out for every P pulses applied. Likewise, the /N circuit provide one pulse out for every N pulses applied. The frequency out of the PLL is N*F/P, where F is the input frequency, and N and P are integers greater than zero and represent a frequency division of an applied signal.

Figure 2:
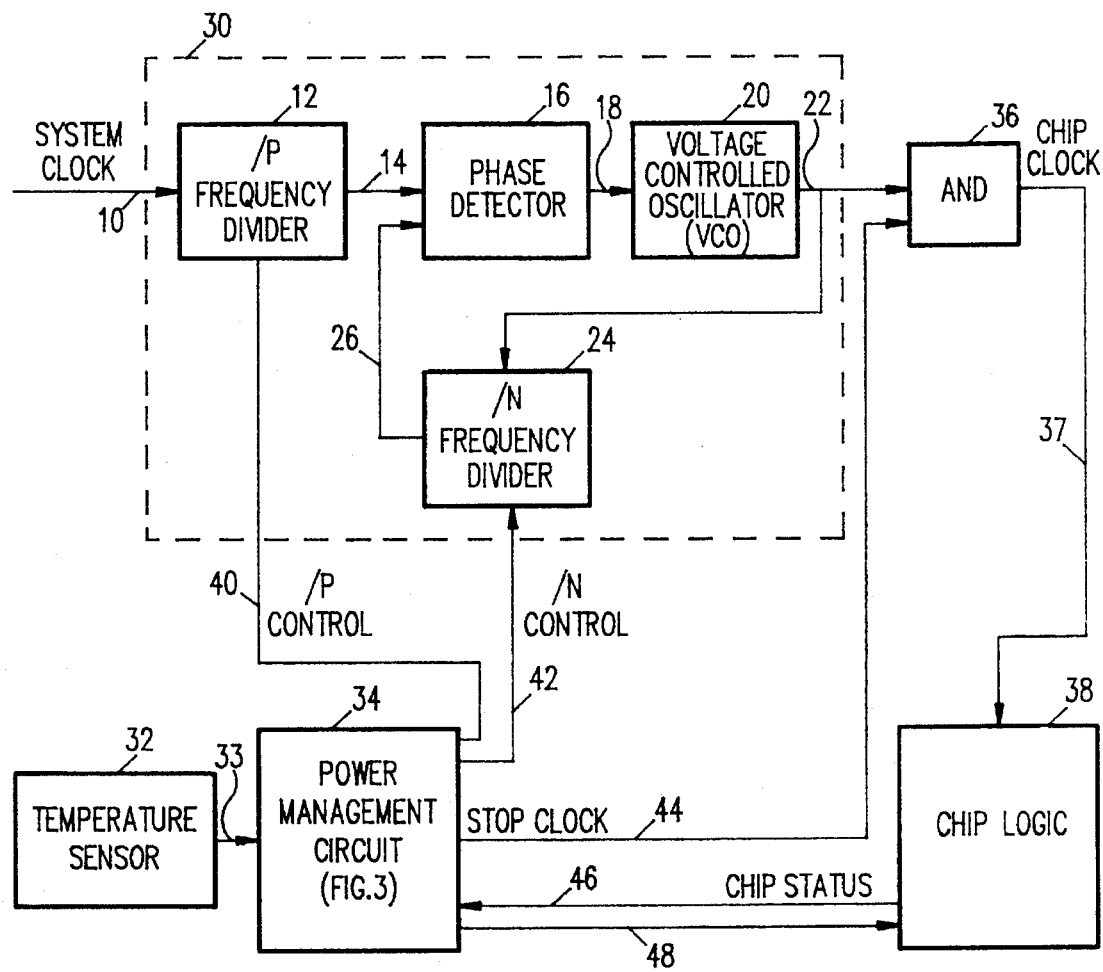
FIG. 2 is a diagram of a system in which the present invention is embodied.

Refer to FIG. 2 which is a diagram of a power dissipation control system in which the present invention is embodied. The power dissipation control system uses a phase locked loop (30) which is of the layout shown in FIG. 1. The PLL (30), a temperature sensor (32), a power management circuit (34), an AND circuit (36) and chip logic (38) are all fabricated on a very large scale integrated circuit (VLSI) chip. The temperature sensor (32) measures the chip temperature and generates a temperature monitoring signal (33) to the power management circuit (34). The chip logic (38) generates a chip status signal (46) to the power management circuit (34) that indicates the functional state of the chip logic. Using the temperature monitoring signal (33) and the chip status signal (46), the power management circuit determines if it is necessary to raise or lower the chip temperature. Two methods are available to the power management circuit for lowering the chip temperature. It can either stop the PLL clock for a period of time or it can reprogram the frequency divider circuits in the PLL.

Inhibiting the PLL output stops all chip logic stop functions so that no power is dissipated in the chip logic. Gating the output of the PLL with the AND (36) permits the PLL to continue operation and therefore provides a way to restart the chip clock waiting to wait for the PLL to regain lock.

Reprogramming the frequency divider circuits in the PLL to reduce the output frequency will reduce the power consumption in the chip logic. The chip logic will then function at lowered performance levels. The chip logic can also signal that it needs a higher frequency. In this case, the power management circuit can dynamically reprogram the frequency divider circuits in the PLL to increase the frequency, provided the power dissipation as measured by the temperature sensor is in an acceptable range. The chip logic will then function but at raised performance levels.

Figure 3:
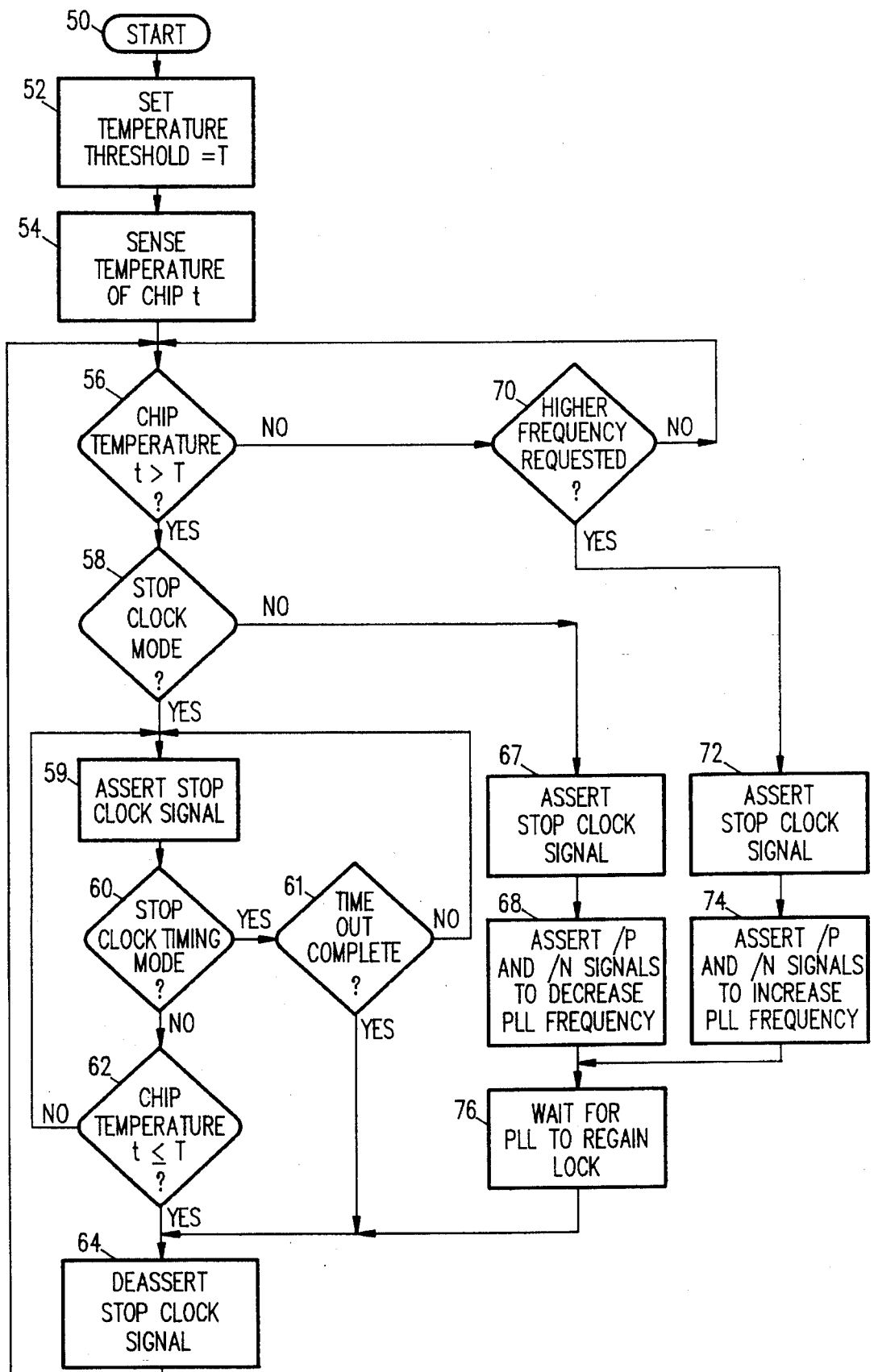
FIG. 3 is a flow diagram of a method of dynamically maintaining chip temperatures in accordance with the present invention.

Refer now to FIG. 3 which is a flow diagram of a method of dynamically maintaining chip temperatures in accordance with the present invention. A temperature threshold level (T) is chosen for normal operation of the chip logic (52). The chip temperature is sensed (54). If the chip temperature (t) is greater than the threshold (T) the flow proceeds to decision block (58). The chip logic generates a chip status signal to the power management circuit that indicates that the chip is or is not in stop clock mode. If in stop clock mode, a yes from decision block (58) causes the flow to proceed to block (60) wherein the stop clock signal is asserted. When the temperature drops to the threshold (T) a yes occurs from decision block (62) and the stop clock signal is deasserted (64).

If at decision block (58) the chip logic did not signal stop clock mode, the flow proceeds to assert the divide by P signal to lower the PLL frequency. Reprogramming the frequency divider circuit in the PLL to reduce the frequency will change the effective duty cycle of the PLL and hence will reduce the power consumption in the chip logic.

The chip logic can also signal that it needs a higher frequency (70). In this case, the power management circuit can reprogram the divide by N frequency divider circuit in the PLL to increase the frequency, provided the power dissipation as measured by the temperature sensor is lower than the threshold (T). The chip logic will then function at raised performance levels.

Figure 4:
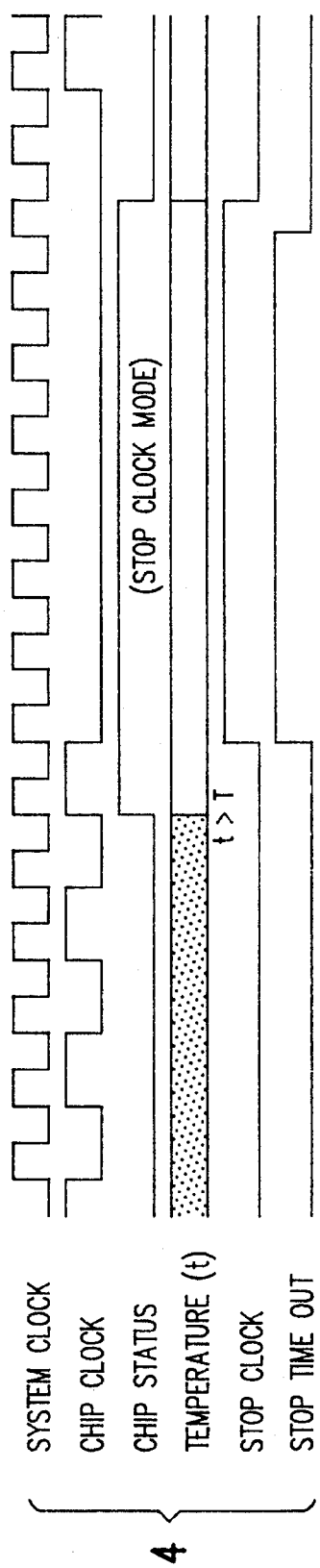
FIG. 4 is a timing diagram of the operation of the invention in timed stop clock mode.

Refer to FIG. 4 which is a timing diagram of the operation of the invention in timed stop clock mode. The system clock (10) of FIG. 2 is running at a frequency F in this example and the chip clock (37) is running at some fraction or multiple of the system clock frequency, ½ F*N/P, as described previously with respect to FIG. 1. The chip status signal line (46) of FIG. 2 indicates stop clock mode. The power management circuit (34) receives a signal (33) from the temperature sensor indicating that the temperature (t) is greater than a set threshold temperature (T). In response to the chip status signal (46) and the temperature signal (33) the power management circuit asserts the stop clock signal (44). This causes the chip clock to stop. Within the power management circuit is a timer function which deasserts the stop clock signal after a specified time period. The chip clock is gated from the AND (36) to the chip logic and operation of the chip logic resumes.

Figure 5:
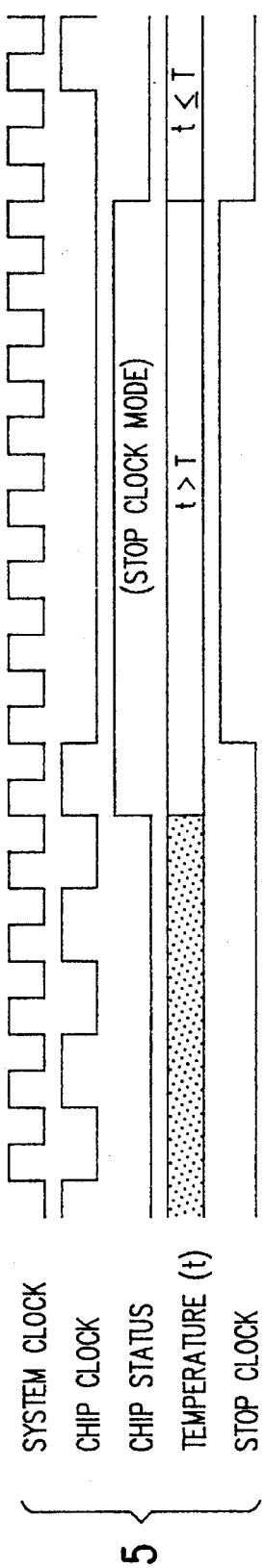
FIG. 5 is a timing diagram of the operation of the invention in a temperature controlled stop clock mode; and, FIG. 6 is a timing diagram of the operation of the invention in a modify frequency mode.

Refer to FIG. 5 which is a timing diagram of the operation of the invention in temperature controlled stop clock mode.

The system clock (10) of FIG. 2 is running at a frequency F in this example and the chip clock (37) is running at some fraction or multiple of the system clock frequency, F*N/P, as described previously with reference to FIG. 1. The chip status signal line (46) of FIG. 2 indicates stop clock mode. The power management circuit (34) receives a signal (33) from the temperature sensor indicating the chip temperature (t) is greater than a set threshold temperature (T). In response to the chip status signal (46) and the temperature signal (33) the power management circuit asserts the stop clock signal (44). This causes the chip clock to stop. When the temperature (t) returns to the threshold temperature (T), the stop clock signal is deasserted by the power management circuit and the chip clock is ungated from the AND (36) to the chip logic and the operation of the chip logic resumes.

Figure 6:
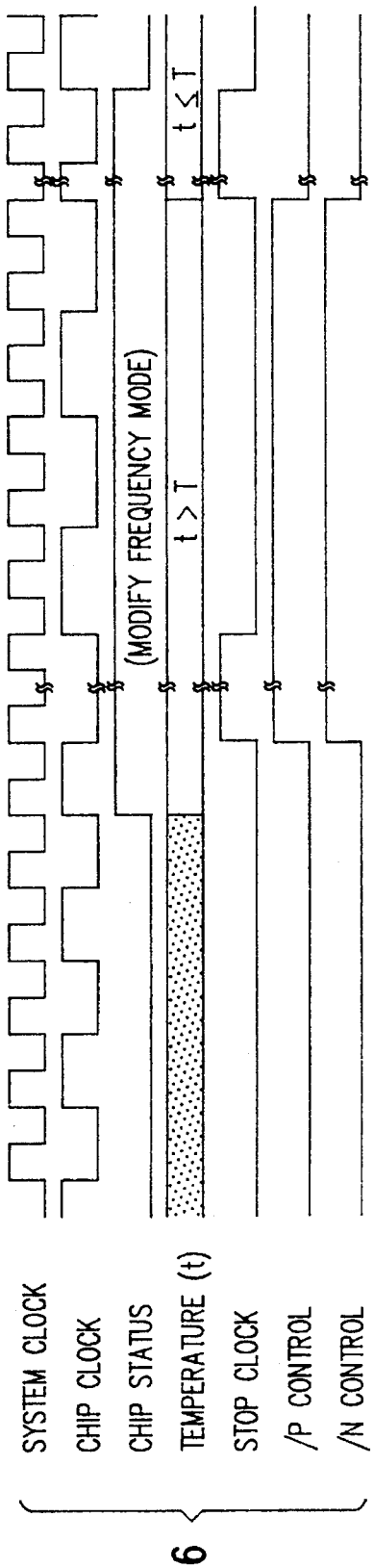

Refer to FIG. 6 which is a timing diagram of the operation of the invention in modify frequency mode. The system clock (10) of FIG. 2 is running at a frequency F in this example and the chip clock is running at some fraction or multiple of the system clock frequency, ½ F*N/P as described previously with respect to FIG. 1. The chip status signal line (46) of FIG. 2 indicates modify frequency mode. The power management circuit (34) receives a signal (33) from the temperature sensor indicating that the chips temperature (t) is greater than a set threshold temperature (T). In response to the chip status signal (46) and the temperature signal (33) the power management circuit asserts the stop clock signal (44). This causes the chip clock to stop. After the chip clock is stopped, the power management circuit asserts control signals /P (40) and /N (42). This reprograms the /P and /N frequency divider circuits to cause the chip PLL (30) to seek a lower frequency. The power management circuit waits for the clip PLL (30) to attain lock before deasserting the stop clock signal (44). The chip logic now operates at a reduced frequency. When the chip temperature (t) returns to the threshold temperature (T), the stop clock signal (44) is asserted by the power management circuit. This causes the chip clock to stop. After the chip clock is stopped, the power management circuit desserts control signals /P (40) and /N (42). This reprograms the /P and /N frequency divider circuits to cause the chip PLL (30) to seek a higher frequency. The power management circuit waits for the chip PLL (30) to attain lock before deasserting the stop clock signal (44). The chip logic now operates at a higher frequency.

Those skilled in the art will understand that the PLL as it is utilized in the preferred embodiment described above, can be replaced with any circuit capable of frequency multiplication or frequency division.

While the invention has been particularly shown and described with reference to preferred embodiments thereof, it will be understood by those skilled in the art that the foregoing and other changes in form and detail may be made therein without departing from the scope of the invention.

What is claimed is:

1. An apparatus including an integrated circuit chip, said apparatus comprising:

chip logic including a functional state output;

sensing means for measuring a temperature of said chip;

clocking means having a clock output connected to said chip logic; and, power management means connected to said functional state output of said chip logic, to said sensing means and to said clocking means;

said power management means including control means responsive to said sensing means and to said functional state output of said chip logic for generating a control signal to said clocking means;

said clocking means including selecting means responsive to said control signal for changing an operating frequency of said clocking means, depending upon a state of said control signal.

2. The apparatus in accordance with claim 1 wherein:

said clocking means includes programmable frequency means; and, said selecting means includes programming means for changing said programmable frequency means to a different operating frequency of said clocking means.

3. An apparatus including an integrated circuit chip, said apparatus comprising:

chip logic including a functional state output;

sensing means for measuring a temperature of said chip;

clocking means having a clock output connected to said chip logic; and, power management means connected to said functional state output of said chip logic, to said clocking means and to said clocking means;

said power management means including control means responsive to said sensing means and to said functional state output of said chip logic for generating a control signal to said clocking means;

said clocking means including selecting means responsive to said control signal for changing an operating frequency of said clocking means, depending upon a state of said control signal;

said selecting means including gate means at said clock output for inhibiting said clock output.

4. The apparatus in accordance with claim 1 wherein:

said selecting means includes means for selectively either disabling said clock output or modifying an operating frequency of said clocking means, depending upon states of said control signal.

5. The integrated circuit chip in accordance with claim 4 wherein:

said clocking means is a phase locked loop clock.

6. The integrated circuit chip in accordance with claim 3 wherein:

said clocking means is a phase locked loop clock.

7. The integrated circuit chip in accordance with claim 3 wherein:

said selecting means includes means for selectively either disabling said clock output or modifying an operating frequency of said clocking means, depending upon states of said control signal.

8. The integrated circuit chip in accordance with claim 7 wherein:

said clocking means is a phase locked loop clock.

9. The integrated circuit chip in accordance with claim 3 wherein:

said clocking means is a phase locked loop clock.

10. An apparatus including an integrated circuit chip, said apparatus comprising:

a chip logic on said integrated circuit chip, said chip logic including a functional state output;

a temperature sensing circuit having a temperature output signal;

said temperature sensing circuit being located such that said temperature sensing circuit detects a temperature of said integrated circuit chip;

a frequency modifying circuit having a clock output connected to said chip logic;

a power management circuit connected to said functional state output of said chip logic and to said temperature output signal; and, a control signal connected between said power management circuit and said frequency modifying circuit;

said power management circuit changing a state of said control signal in response to said temperature output signal and to said functional state output of said chip logic;

said frequency modifying circuit including a frequency modifying circuit logic that changes an operating frequency of said frequency modifying circuit in response to said state of said control signal.

11. The apparatus in accordance with claim 10 wherein:

said frequency modifying circuit logic includes a programmable frequency divider; and, said programmable frequency divider providing a different operating frequency of said frequency modifying circuit in response to said state of said control signal.

12. The integrated circuit chip in accordance with claim 11 wherein:

said frequency modifying circuit is a phase locked loop clock.

13. The apparatus in accordance with claim 10 wherein:

said frequency modifying circuit includes a programmable frequency divider; and, said means responsive to said control signal includes means for selectively either disabling said frequency modifying circuit clock output or modifying an operating frequency thereof, depending upon stakes of said control signal.

14. The integrated circuit chip in accordance with claim 10 wherein:

said frequency modifying circuit is a phase locked loop clock.

15. An integrated circuit chip comprising:

a chip logic including a functional state output;

a temperature sensing circuit;

a frequency modifying circuit having a clock output connected to said chip logic; and, a power management circuit connected to said chip logic, to said temperature sensing circuit and to said frequency modifying circuit;

said power management circuit including means responsive to said temperature output signal and to said functional state output of said chip logic for generating a control signal to said frequency, modifying circuit;

said frequency modifying circuit including means responsive to said control signal for changing an operating frequency thereof, depending upon a state of said control signal;

said means responsive to said control signal including a gate at an output of said frequency modifying circuit.

16. The integrated circuit chip in accordance with claim 15 wherein:

said clocking means is a phase locked loop clock.

17. The integrated circuit chip in accordance with claim 15 wherein:

said frequency modifying circuit is a phase locked loop clock.

18. A method of controlling heat dissipation in an integrated circuit chip having chip logic thereon, said chip logic including a functional state output; a method comprising steps of:

A. establishing a threshold temperature (T);

B. sensing a temperature (t) of said chip;

C. clocking said chip with an output of a frequency modifying circuit connected to said chip logic; and, D. modifying said output of said frequency modifying circuit in accordance with a predetermined relationship between said temperature (t) and said threshold temperature (T).

19. The method in accordance with claim 18 wherein said frequency modifying circuit includes programmable logic, said step D including a step of:

E. programming said programmable logic to a higher frequency value upon a condition that said temperature (t) is greater than said threshold temperature (T).

20. The method in accordance with claim 18 wherein said frequency modifying circuit includes programmable logic, said step D including the step of:

E. programming said programmable logic to a higher frequency value upon a condition that said temperature (t) is lower than said threshold temperature (T).

21. The method in accordance with claim 18 wherein said step D includes a step of:

E. preventing said output of said frequency modifying circuit from reaching said chip logic upon a condition that said temperature (t) is greater than said threshold temperature (T).

22. A method of controlling heat dissipation in an integrated circuit chip having chip logic thereon, said chip logic including a functional state output; a method comprising steps of:

A. establishing a threshold temperature (T);

B. sensing a temperature (t) of said chip;

C. clocking said chip with an output of a frequency modifying circuit connected to said chip logic;

D. modifying said output of said frequency modifying circuit in accordance with a predetermined relationship between said temperature (t) and said threshold temperature (T); and, E. preventing said output of said frequency modifying circuit from reaching said chip logic upon a condition that said temperature (t) is greater than said threshold temperature (T).

* * * * *